United States Patent
Srivastava et al.

(10) Patent No.: US 9,571,134 B2
(45) Date of Patent: Feb. 14, 2017

(54) TRANSMIT NOISE REDUCER

(71) Applicant: RAYTHEON COMPANY, Waltham, MA (US)

(72) Inventors: Tina P. Srivastava, Tewksbury, MA (US); Matthew A. Morton, Tewksbury, MA (US); John Cangeme, Tewksbury, MA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/560,842

(22) Filed: Dec. 4, 2014

(65) Prior Publication Data

US 2016/0164552 A1 Jun. 9, 2016

(51) Int. Cl.
H04B 1/04 (2006.01)
H04B 1/00 (2006.01)
H03G 11/00 (2006.01)
H03H 2/00 (2006.01)

(52) U.S. Cl.
CPC ............ H04B 1/0475 (2013.01); H03H 2/001 (2013.01)

(58) Field of Classification Search
CPC ............. H04B 1/04; H04B 1/40; H04B 15/00; H03G 3/3036; H03G 3/3042
USPC .......... 455/63.1, 67.13, 114.2; 375/296, 297; 333/17.2, 100, 109, 110, 201
See application file for complete search history.

(56) References Cited

U.S. PATENT DOCUMENTS

| | | | |
|---|---|---|---|
| 4,283,692 A | 8/1981 | Adam | |
| 4,488,122 A | 12/1984 | Wolkstein | |
| 5,307,516 A | 4/1994 | Nomoto | |
| 5,483,161 A | 1/1996 | Deeter et al. | |
| 5,523,725 A * | 6/1996 | Ishikawa | H03H 2/001 333/17.2 |
| 5,785,752 A | 7/1998 | Tanno et al. | |
| 5,802,463 A | 9/1998 | Zuckerman | |
| 5,831,439 A | 11/1998 | Suenram et al. | |
| 5,923,228 A | 7/1999 | Okada et al. | |
| 6,028,495 A | 2/2000 | Umegaki | |
| 6,111,911 A | 8/2000 | Sanderford, Jr. et al. | |
| 6,584,304 B1 | 6/2003 | Thomsen et al. | |
| 6,850,132 B2 * | 2/2005 | Jun | H01P 5/10 333/201 |
| 6,937,112 B2 | 8/2005 | Jun et al. | |

(Continued)

OTHER PUBLICATIONS

Bohn et al., "Closed-Loop Spurious Tone Reduction for Self-Healing Frequency Synthesizers," IEEE, 4 pages, 2011.

(Continued)

*Primary Examiner* — Quochien B Vuong

(74) *Attorney, Agent, or Firm* — Lewis Roca Rothgerber Christie LLP

(57) ABSTRACT

A transmit drive circuit with high signal to noise and frequency agility. In one embodiment, a transmit circuit includes a digital to analog converter, an amplifier, and a signal to noise enhancer, the signal to noise enhancer being a nonlinear passive device that attenuates low-power signals while transmitting high power signals with little loss. The signal to noise enhancer may be fabricated as a thin film of yttrium iron garnet (YIG) epitaxially grown on a gadolinium gallium garnet (GGG) substrate, the GGG substrate secured to a microwave transmission line from the input to the output of the signal to noise enhancer, such that the thin film of yttrium iron garnet is close to the transmission line.

17 Claims, 6 Drawing Sheets

(56) References Cited

U.S. PATENT DOCUMENTS

| | | | |
|---|---|---|---|
| 6,975,264 B2* | 12/2005 | Nendick | G01S 7/021 455/106 |
| 7,092,043 B2 | 8/2006 | Vorenkamp et al. | |
| 7,542,519 B2* | 6/2009 | McCallister | H04B 1/0075 455/114.3 |
| 7,693,491 B2* | 4/2010 | Pan | H04B 1/036 455/114.2 |
| 8,461,901 B1 | 6/2013 | Morton et al. | |
| 2003/0214363 A1 | 11/2003 | Jun et al. | |
| 2009/0184773 A1 | 7/2009 | Woo et al. | |
| 2012/0194893 A1 | 8/2012 | Maleki et al. | |

OTHER PUBLICATIONS

Jeon et al., "A Scalable 6-to-18 GHz Concurrent Dual-Band Quad-Beam Phased-Array Receiver in CMOS," IEEE Journal of Solid-State Circuits, 43(12):2660-2673, Dec. 2008.

Saha et al., "A Tunable, SiGe X-band Image Reject Mixer," IEEE, pp. 196-199, 2010.

Wang et al., "A Tunable Concurrent 6-to-18GHz Phased-Array System in CMOS," IEEE, pp. 687-690, 2008.

Stitzer et al., "Magnetostatic Surface Wave Signal-To-Noise Enhancer," IEEE MTT-S-Digest, Westinghouse Electric Corp., pp. 238-240, 1980.

Adam, "A Broadband Microwave Signal to Noise Enhancer," IEEE Transactions on Magn., 16(5):1168-1170, Sep. 1980.

Kuki et al., "A Reflection Type of MSW Signal-To-Noise Enhancer in the 400-MHz Band," IEEE MTT-S Digest, pp. 111-114, 1995.

Nomoto et al., "A Signal-To-Noise Enhancer Using Two MSSW Filters and its Application to Noise Reduction in DBS Reception," IEEE Trans. On Microwave Theory and Tech., 41(8):1316-1322, Aug. 1993.

International Search Report from corresponding International Application No. PCT/US2015/063533, International Search Report dated Aug. 31, 2016 and mailed Sep. 8, 2016 (4 pgs.).

Written Opinion of the International Searching Authority from corresponding International Application No. PCT/US2015/063533, mailed Sep. 8, 2016 (8 pgs.).

* cited by examiner

TRANSMIT NOISE REDUCER

BACKGROUND

1. Field

One or more aspects of embodiments according to the present invention relate to transmitting circuits, and more particularly to a system for transmitting a signal with reduced noise.

2. Description of Related Art

Systems transmitting radio frequency (RF) or microwave signals are on occasion deployed near each other with carrier frequencies that are offset by small frequency differences. In such systems it may be desirable to reduce interference that otherwise may be caused by noise in amplifiers or digital to analog converters propagating through the transmit chain. Such interference may degrade the signal to noise ratio in a system receiving one of the modulated carriers, or, if it is of sufficiently large magnitude, drive the receive system into compression.

Thus, there is a need for a system for reducing the noise at frequencies near a carrier in a transmission system.

SUMMARY

Aspects of embodiments of the present disclosure are directed toward a transmit drive circuit with high signal to noise and frequency agility. In one embodiment, a transmit circuit includes a digital to analog converter, an amplifier, and a signal to noise enhancer, the signal to noise enhancer being a nonlinear passive device that attenuates low-power signals while transmitting high power signals with little loss. The signal to noise enhancer may be fabricated as a thin film of yttrium iron garnet (YIG) epitaxially grown on a gadolinium gallium garnet (GGG) substrate, the GGG substrate secured to a microwave transmission line from the input to the output of the signal to noise enhancer, such that the thin film of yttrium iron garnet is close to the transmission line.

According to an embodiment of the present invention there is provided a transmit system, including: a digital-to-analog converter (DAC) having a digital input and an analog output; a first amplifier, having an input and an output, the input of the amplifier being connected to the analog output of the DAC; and a first signal-to-noise enhancer (SNE) having an input and an output, the first SNE including: a microwave transmission line connected between the input and the output of the first SNE; a magnetic component capable of supporting magnetostatic waves; the magnetic component secured in proximity to the microwave transmission line; one or more magnets secured in proximity to the magnetic component; the first SNE having the characteristic of allowing a signal to propagate from the input of the first SNE to the output of the first SNE: with a first attenuation when the power of the signal at the input of the SNE is less than a first threshold, and with a second attenuation when the power of the signal at the input of the SNE is greater than a second threshold, the first attenuation exceeding the second attenuation by at least 5 decibels (dB).

In one embodiment, the output of the first SNE is connected to a transmitting antenna.

In one embodiment, the magnetic component includes a thin film of yttrium iron garnet (YIG) on a gadolinium gallium garnet (GGG) substrate.

In one embodiment, the thin film of YIG is a single crystal of YIG, the GGG substrate is a single crystal of GGG, and the thin film of YIG is lattice-matched to the GGG substrate.

In one embodiment, a portion of the transmission line in proximity with the magnetic component follows a substantially straight path.

In one embodiment, the one or more magnets include two magnets, positioned and oriented with respect to the portion of the microwave transmission line so as to produce, in the magnetic component, a biasing magnetic field substantially parallel to the portion of the microwave transmission line.

In one embodiment, the transmit system includes a plurality of additional components connected in cascade to form a chain having an input and an output, the output of the first SNE connected to the input of the chain, the plurality of additional components including one or more additional SNEs and one or more additional amplifiers, the additional SNEs and the additional amplifiers alternating in the chain, each additional SNE of the one or more additional SNEs having an input and an output, each additional SNE of the one or more additional SNEs including: a microwave transmission line connected between the input and the output of the additional SNE; a magnetic component capable of supporting magnetostatic waves; the magnetic component secured in proximity to the microwave transmission line; one or more magnets secured in proximity to the magnetic component; each additional SNE of the one or more additional SNEs having the characteristic of allowing a signal to propagate from the input of the additional SNE to the output of the additional SNE: with a first attenuation when the power of the signal at the input of the SNE is less than a first threshold, and with a second attenuation when the power of the signal at the input of the SNE is greater than a second threshold, the first attenuation exceeding the second attenuation by at least 5 decibels (dB).

In one embodiment, the chain includes, as a final element, an amplifier of the one or more additional amplifiers.

In one embodiment, the chain includes, as a final element, an SNE of the one or more additional SNEs.

In one embodiment, the output of the chain is connected to a transmitting antenna.

According to an embodiment of the present invention there is provided a transmit system, including: a first amplifier, having an input and an output; a plurality of signal-to-noise enhancers (SNEs) having an input and an output, each signal-to-noise enhancer (SNE) of the plurality of SNEs including: a microwave transmission line connected between the input and the output of the first SNE; a magnetic component capable of supporting magnetostatic waves; the magnetic component secured in proximity to the microwave transmission line; one or more magnets secured in proximity to the magnetic component; the first SNE having the characteristic of allowing a signal to propagate from the input of the first SNE to the output of the first SNE: with a first attenuation when the power of the signal at the input of the SNE is less than a first threshold, and with a second attenuation when the power of the signal at the input of the SNE is greater than a second threshold, the first attenuation exceeding the second attenuation by at least 5 decibels (dB); and the plurality of SNEs including a first SNE and a plurality of additional SNEs, the input of the first SNE being connected to the output of the first amplifier; a plurality of additional components including: one or more splitters; and a plurality of additional amplifiers, the plurality of additional components and the plurality of additional SNEs being connected in a tree structure having an input and a plurality of outputs, the output of the first SNE connected to the input of the tree structure.

In one embodiment, each output of the plurality of outputs of the tree structure is connected to a transmitting antenna.

In one embodiment, the transmit system includes an input and a plurality of outputs; the output of the first SNE is connected to the input of the first splitter; each of the outputs of the first splitter is connected to one of a plurality of first cascades, each of the first cascades being a cascade of an amplifier of the additional amplifiers and an SNE of the additional SNEs, each of the first cascades including an input and an output, the input of each first cascade being connected to the input of the amplifier of the first cascade, the output of the amplifier of each first cascade being connected to the input of the SNE of the first cascade, and the output of, the SNE of each first cascade being connected to the output of the first cascade.

In one embodiment, the output of each cascade of the plurality of first cascades is connected to a transmitting antenna.

In one embodiment, the transmit system includes an input and a plurality of outputs; the input of each of the plurality of second splitters being connected to the output of a respective first cascade, each output of each of the plurality of second splitters being connected to one of a plurality of second cascades, each of the second cascades being a cascade of an amplifier of the additional amplifiers and an SNE of the additional SNEs, each of the second cascades including an input and an output, the input of each second cascade being connected to the input of the amplifier of the second cascade, the output of the amplifier of each second cascade being connected to the input of the SNE of the second cascade, and the output of the SNE of each second cascade being connected to the output of the second cascade.

In one embodiment, the output of each cascade of the plurality of second cascades is connected to a transmitting antenna.

In one embodiment, the transmit system includes a digital-to-analog converter (DAC) having a digital input and an analog output, the output of the DAC being connected to the input of the first amplifier.

BRIEF DESCRIPTION OF THE DRAWINGS

Features, aspects, and embodiments are described in conjunction with the attached drawings, in which.

DETAILED DESCRIPTION

Figure 1:
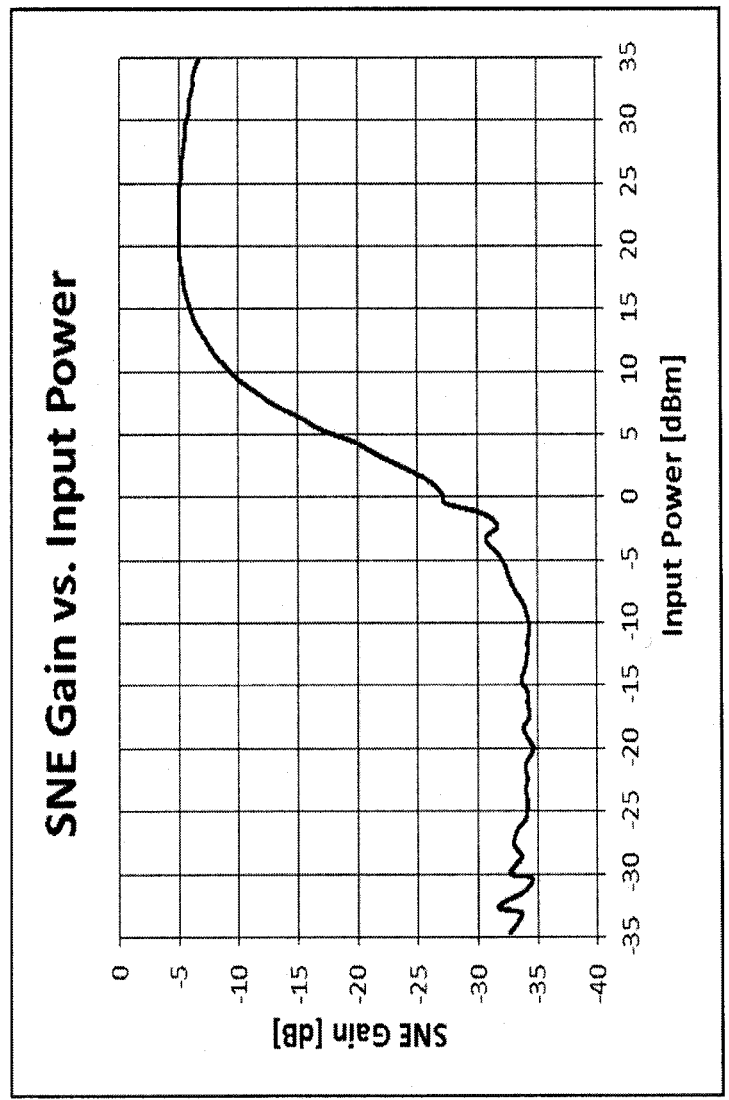
FIG. 1 is a graph of the gain of a signal to noise enhancer as a function of input power, according to an embodiment of the present invention.

The detailed description set forth below in connection with the appended drawings is intended as a description of exemplary embodiments of a transmit noise reducer provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

The wide availability of high speed data converters has enabled a significant increase in capability for telecommunications, radar, electronic warfare, and other such military and commercial systems. With the ability to generate complex waveforms with up to several hundreds of MHz instantaneous bandwidth, and the corresponding ability to digitize such waveforms, these new capabilities can be leveraged by using them in architectures that support frequency conversion between the high frequency of the RF band of interest and the relatively low RF frequencies of the data converters. As is known in the related art, filters are required at the output of a digital to analog converter (DAC) and at the input of an analog to digital converter (ADC) to select the appropriate Nyquist zone. These filters attenuate signals in adjacent Nyquist zones, decreasing the out-of-band spurious signals associated with the data conversion process. For example, in a DAC-driven transmit chain, a combination of a DAC, a Nyquist select filter, a driver amp, a mixer, a filter on the output of the mixer, and a high power amplifier may be connected in cascade. While the Nyquist select fixed filter attenuates noise and spurious signals outside of the operational band of the DAC, broadband noise (from both thermal and quantization sources) within the operational band of the DAC may be fed through the transmit chain. This noise is then amplified by the driver amp, and any remaining broadband noise after the post-mixer filter is also amplified by the high power amplifier.

For a phased array system, each element may be driven by its own DAC (with the transmit chain featuring several copies of the cascade described above), or a single DAC may be used to drive multiple elements. If a single DAC is used, an N-way splitter may be used to distribute the transmit signal to N modules that apply independent amplitude and phase weights to each signal before amplification in a high power amplifier at every element. Again, the broadband noise of the DAC is amplified by the amplifiers in the common transmit chain, and again by each high power amplifier at every element. Unlike the noise sources associated with components within each element, some noise sources, such as those associated with the common chain (including the DAC, if a single DAC is used), may be coherent, and thus add constructively to increase the total transmitted noise.

Transmit noise causes several problems. One such problem is electromagnetic interference with separate systems that are either co-located with or sufficiently close to the noisy transmitter. Even if the separate system is operating in a different frequency band, the transmitted noise can be sufficient to raise the effective noise floor of the receive chain, or possibly drive the receive system into compression.

Addressing these problems using filtering of the signal using conventional fixed or tunable filters may be challenging because high quality factor (high Q) filters may be needed to provide significant noise attenuation at frequencies near the carrier. Such filters may be costly and any error in the center frequency of the filter (e.g., as a result of drift in the filter parameter) may lead to an unacceptable loss of carrier power.

Cancellation approaches may be used to suppress some interference. For example, a direct sample of the transmitted signal may be fed back into the receive chain with appropriate amplitude and time delay weights to cancel the signal returned from the aperture, or a cancellation signal may be generated through another DAC in an attempt to match the interfering signal. In each case, information about, or a sample of, the transmitted signal is needed; this may be impractical in geographically separated transmit-receive systems, such as cellular communication towers. Moreover, these approaches are not effective at reducing the broadband noise associated with the transmit chain.

The signal to noise enhancer (SNE) is a nonlinear passive device that attenuates signals below a first threshold power while passing signals above a second threshold power. FIG. 1 shows the gain of an SNE as a function of input power, when the input contains a single tone within the operating frequency range of the SNE. As the power is increased from −35 dBm to −9 dBm, the transmission loss remains greater than 32 dB (i.e., the gain remains less than −32 dB). As the power is increased above a first threshold power of −9 dBm, the loss decreases (i.e., the gain increases) to reach a loss of approximately 8 dB at a second threshold power of 12 dBm. Thus, the SNE provides high attenuation for signals with power below the first threshold power and low attenuation for signals with power above the second threshold power, the difference, in this example, being approximately 24 dB. The characteristics of an SNE may vary according to the details of its design, so that an SNE may exhibit, for example, less loss for a high-power tone, and the difference in attenuation between a high-power tone and a low-power tone (which also depends on how the first and second power thresholds are chosen) may be greater or less than the 24 dB of this example. In embodiments of the present invention, an SNE with a difference in attenuation (between a high power tone and a low power tone) of as little as 5 dB may provide useful performance benefits.

Figure 2:
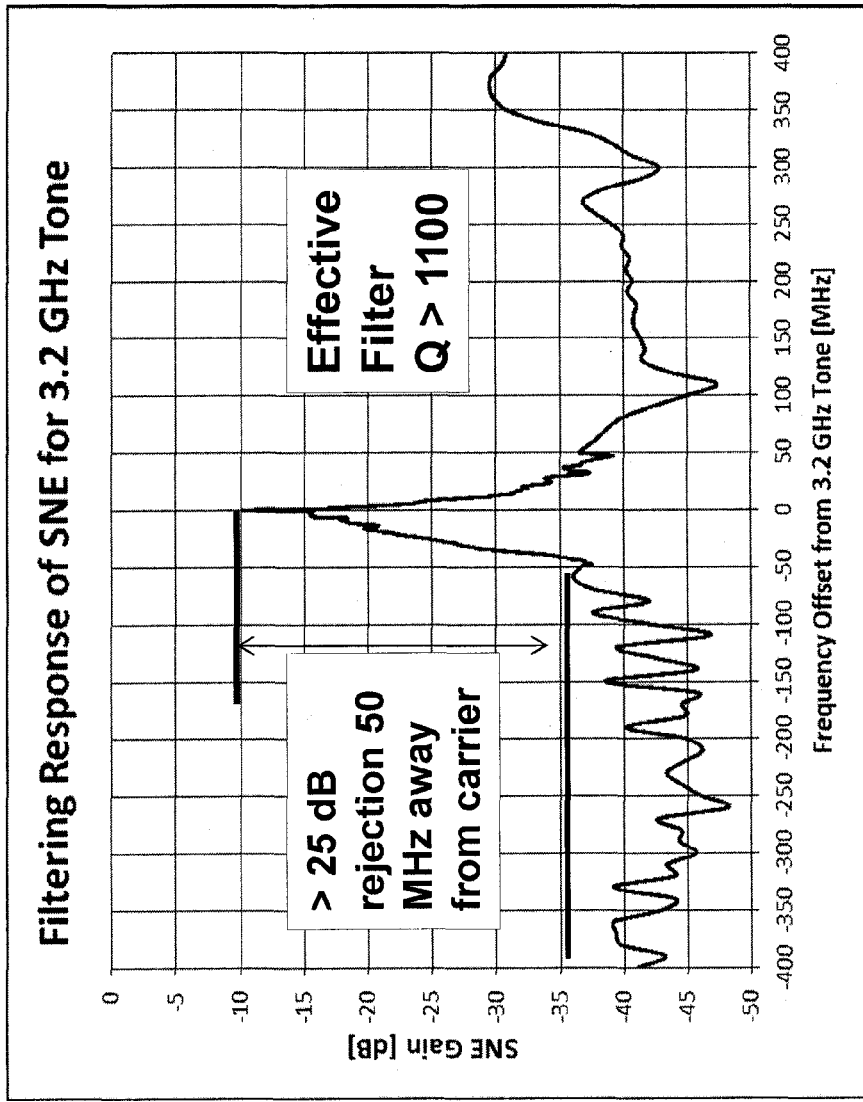
FIG. 2 is a graph of the gain of a signal to noise enhancer as a function of input frequency relative to the frequency of a principal tone, according to an embodiment of the present invention.

Referring to FIG. 2, a key feature of the SNE is the frequency selective nature of the high-power passband: low power signals close in frequency to the passed high-power signals are subject to high levels of attenuation. In particular, referring to FIG. 2, when the input signal includes a principal 12 dBm tone at 3.2 GHz and one or more weak signals at other frequencies, the principal tone is attenuated by 10 dB or less and signals at other frequencies that are 50 MHz or more from the principal tone are attenuated by at least 25 dB more than the amount by which the principal tone is attenuated. To achieve this level of attenuation 50 MHz from the center frequency of 3.2 GHz, a conventional linear filter would need a quality factor (Q) of over 1000. In this sense, the SNE acts as a high-Q (>1000) notch filter that automatically tunes to pass high power signals while rejecting low power signals in adjacent frequency bands.

The characteristic of FIG. 2 corresponds to a measurement in which a low-power test tone was swept in frequency over a first range of frequencies extending below the frequency of the principal tone, and over a second range of frequencies extending above the frequency of the principal tone. Measurements of the attenuation of a test tone very near in frequency to the principal tone are challenging because of the large amplitude difference between the test tone and the principal tone; the characteristic of FIG. 2 thus excludes measurements of the attenuation (expected to be less than the minimum 10 dB attenuation shown) over a small frequency interval including the principal tone.

Figure 3:
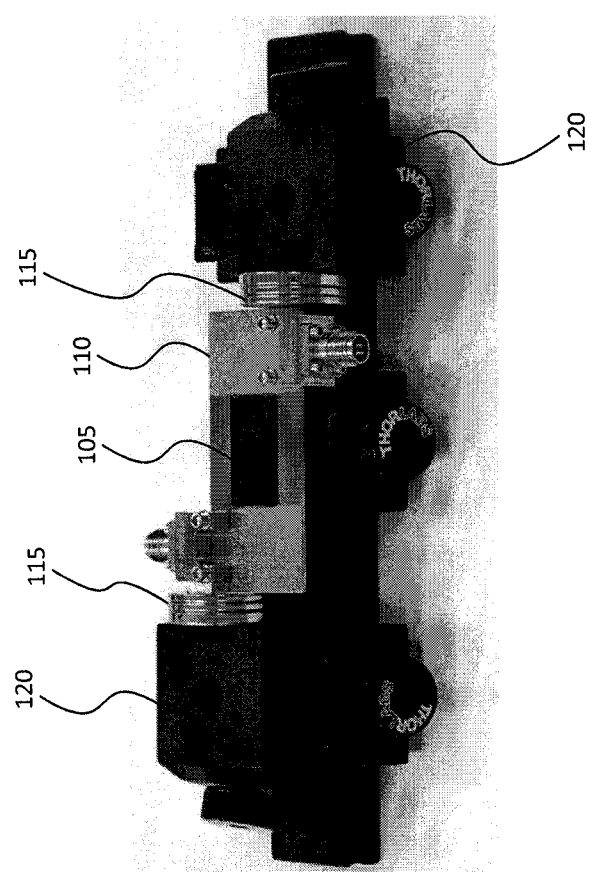
FIG. 3 is a photograph of a signal to noise enhancer, according to an embodiment of the present invention.

In one embodiment, the SNE is built according to the disclosure in U.S. Pat. No. 4,283,692 (the "'692 Patent"), which is incorporated herein by reference in its entirety. FIG. 3 is a photograph of a prototype SNE. A thin film of yttrium iron garnet (YIG) epitaxially grown on a gadolinium gallium garnet (GGG) substrate 105 is secured, with the thin film side down, on or immediately above a straight portion of a microstrip transmission line fabricated on a surface of a dielectric substrate 110. A DC bias magnetic field is applied to the YIG sample in a direction parallel to the straight portion of the microstrip transmission line by two magnets 115. Each magnet may be a permanent magnet, as shown in FIG. 3, or it may be any other variety of magnet, such as an electromagnet. The thin film of YIG and the GGG substrate may each be a single crystal, and the thin film of YIG may be lattice-matched to the GGG substrate. In the prototype SNE of FIG. 3, the positions of the magnets are adjustable using translation stages 120; in a production unit the magnets may be installed in fixed positions identified, using the prototype, by adjusting the magnet positions in the prototype for acceptable performance. In other embodiments, a single magnet may be used instead of a pair of magnets, or more than two magnets may be used.

In one embodiment, the propagation of electromagnetic signals along the transmission line excites magnetostatic waves (MSW) in the YIG film of the SNE; the MSW are long wavelength spin waves which may propagate at microwave frequencies in ferromagnetic materials placed within a biasing magnetic field. Microwave energy is coupled from the transmission line to MSW that propagate away from the transmission line. In order to prevent the MSW from reflecting from the edge of the film and interfering with the signal propagating along the transmission line, the edge of the film may be ground at an angle, e.g., forming a bevel on the lower edges of the GGG substrate and YIG film, or the GGG substrate may be formed as a curved surface (e.g., the GGG substrate and YIG film may be in the shape of a circular disk). In other embodiments, the MSW may be attenuated using a conductive material, such as a 0.6 nm layer of aluminum, deposited onto the surface of the microstrip dielectric substrate, sufficiently far from the transmission line to avoid significantly affecting modes propagating in the transmission line.

The coupling of energy from waves travelling in the microstrip transmission line into magnetostatic surface waves may be increased by depositing a metal (e.g., gold) film on the YIG film in a pattern forming a slot parallel to the microstrip transmission line, or a coplanar structure with a central conductor parallel to the microstrip transmission line, between two coplanar ground planes.

In operation, magnetostatic surface waves are launched and propagated in the YIG film in response to an input signal applied to the microstrip transmission line. Magnetostatic volume waves are also possible with different directions of the magnetizing field relative to the YIG film, as is well known to those skilled in the art. Magnetostatic surface waves and magnetostatic volume waves are collectively referred to herein as magnetostatic waves (MSW). The launching of a magnetostatic wave removes power from the transmission line such that the output signal at the output of the SNE is attenuated relative to the input signal at the input of the SNE.

Due to the nonlinear nature of the MSW excitation and propagation, the amount of energy that can be coupled from the transmission line to MSW is limited. Therefore, above a certain power level of the exciting signal, saturation occurs and no additional power can be coupled to MSW. As a result, for low signal power levels, the microwave energy is coupled from the transmission line to MSW. In contrast, for high signal power levels, the coupling to MSW saturates and the amount of loss imparted on the signal propagating from the input to the output of the SNE is reduced. This behavior gives rise to a significant enhancement of the signal-to-noise ratio when the noise power is less than the first threshold power of the SNE and the signal is a tone with power greater than the second threshold power of the SNE.

Figure 4A:
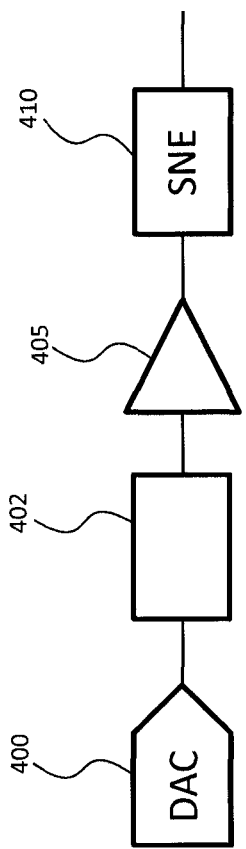
FIG. 4A is a schematic block diagram of a chain of components in a transmit system, according to an embodiment of the present invention.
Figure 4B:
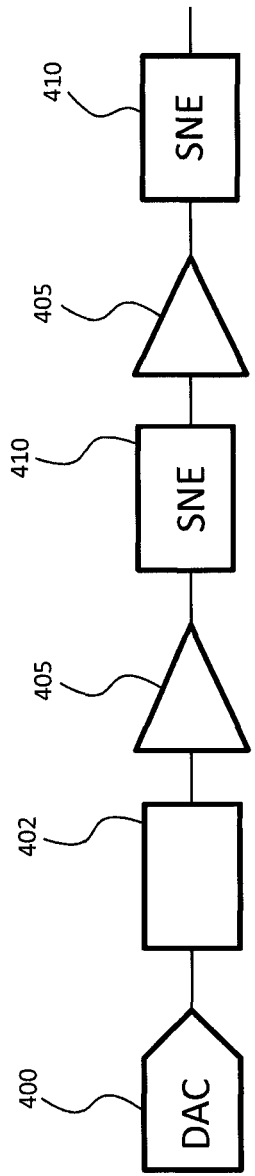
FIG. 4B is a schematic block diagram of a chain of components in a transmit system, according to another embodiment of the present invention.
Figure 4C:
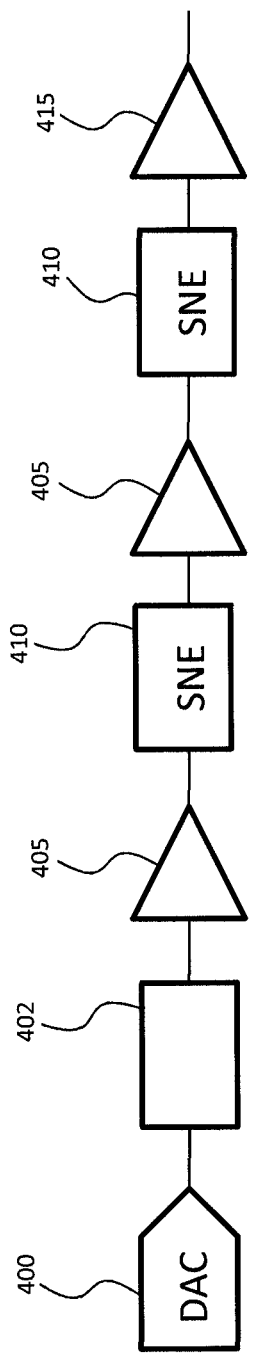
FIG. 4C is a schematic block diagram of a chain of components in a transmit system, according to another embodiment of the present invention.

Referring to FIGS. 4A-4C, in one embodiment a DAC 400 is followed by a fixed Nyquist select filter 402, by an amplifier 405 and by a first SNE 410, and optionally by additional amplifiers 405 and SNEs 410. The DAC may be followed by the Nyquist select filter 402 and then by an amplifier to boost the power of the principal tone in the signal to above the second threshold power, so that the principal tone will not be too greatly attenuated by the SNE 410; the gain of the amplifier may be selected, for example, so that the power at the input to the SNE 410 is within the design input power range of the SNE 410, e.g., 15-25 dBm. In some embodiments an SNE may have a design input power range with a significantly higher upper limit.

In the embodiment of FIG. 4A, the chain of components ends at the output of the first SNE 410, i.e., the output of the SNE 410 is the output of the circuit, which may, for example, be connected to a radiating or "transmitting" antenna. In other embodiments, additional pairs of amplifiers 405 and SNEs 410 may be added, each pair providing additional gain. FIG. 4B shows an example of such an embodiment, in which an amplifier 405 and an SNE 410 have been added to the embodiment of FIG. 4A. A configuration like the one of FIG. 4B with an SNE 410 after the final amplifier 405 in the chain may be suitable for applications where the degradation in efficiency (i.e., the loss of the SNE for the principal tone, which may be 2-4 dB) is outweighed by the desire to achieve the lowest transmit noise power.

Each SNE 410 improves the signal to noise ratio but it also attenuates the principal tone; in applications in which high output power is of greater value than high signal-to-noise ratio at the output, it may be advantageous to employ an amplifier, which may be a high power amplifier 415 as the final element in the chain, as illustrated in FIG. 4C. In the embodiment of FIG. 4C, the final amplifier 415 is not followed by an SNE and is therefore not constrained to produce an output power within the design input power range of the SNE 410. In particular it may produce significantly higher power, e.g., 10 W, 100 W, or 1,000 W or more.

Figure 5:
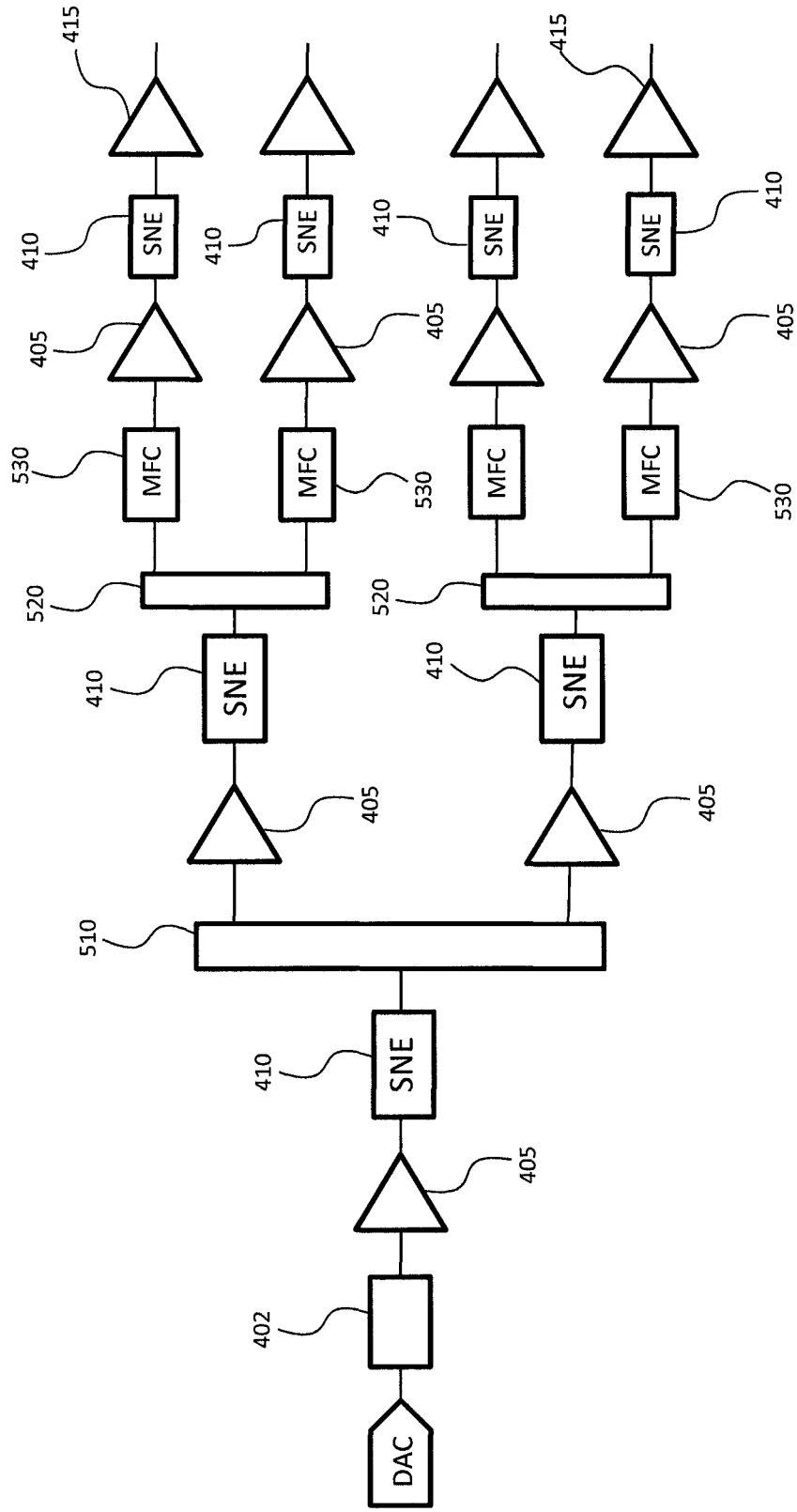
FIG. 5 is a schematic block diagram of a plurality of components arranged in a tree structure, according to an embodiment of the present invention.

Referring to FIG. 5, in one embodiment, several SNEs 410 are used in an array antenna application. As in the embodiment of FIG. 4, a first SNE 410 is used after the DAC 400 (after the fixed Nyquist select filter 402) to provide an immediate improvement in the DAC's signal to noise ratio. The signal at the output of the first SNE 410 is then split by a first splitter 510 into several paths, or "first branches" (25 in the embodiment of FIG. 5), each corresponding to a subarray of the array antenna. The signal in each first branch is amplified to overcome power lost during the split, and sent through another SNE 410 to provide an additional improvement to the transmit signal to noise ratio. The signal in each of the first branches is then split again, by a plurality of second splitters 520, into several paths, or "second branches" (200 paths per subarray in the embodiment of FIG. 5), where individual amplitude and phase weights are applied with a multifunction circuit (MFC) 530, and the signal is amplified again before passing through another SNE for still more improvement in the transmit signal to noise ratio. The signal in each second branch is finally amplified by a high power amplifier 415. In this embodiment the signal path from the output of the first SNE 410 has a tree structure, the tree having a single input (connected to the output of the first SNE 410), the signal at the input of the tree being split one or more times as it propagates to a plurality of outputs (the outputs of the final high power amplifiers 415). Each of the plurality of outputs may then be connected to a transmitting antenna.

Because the signal power level in the system drops after each splitter and is then raised again by subsequent amplification, there may be (as illustrated in FIG. 5) multiple points in the system suitable for the placement of SNEs, i.e., points at which the signal power level is within the design input power range of the SNEs 410. Employing SNEs in the first and second branches of the system also carries the additional benefit that these SNEs repeatedly attenuate noise of common origin, e.g., quantization noise from the DAC 400 or noise produced by the first amplifier 405 following the DAC 400. This noise is coherent in all of the second branches and thus contributes coherently to the noise at the receiver, potentially resulting in greater degradation in signal to noise ratio at the receiver than incoherent noise produced, for example, in the amplifiers in the first or second branches.

A transmit system according to embodiments of the present invention comprising a DAC 400 and an SNE 410 provides improved rejection of transmit noise generated by the DAC 400. Further, the auto-tuning nature of the SNE 410 and the SNE's ability to achieve a high-Q filter response over a wide operational tuning range without additional control makes the proposed architecture attractive for wideband transmit systems.

While it would be possible, in an array antenna drive circuit, to use a chain of multiple amplifiers and SNEs to maximize the DAC SNR prior to splitting the signal, the coherent noise created by the splitters and subsequent amplifiers would not be attenuated further, degrading the overall transmit noise characteristic. By partitioning the SNE functions across the array as proposed, the noise associated with the DAC is decreased at each level of subarray, while the noise from signal splitting components, amplifiers, and MFCs is also addressed. If an SNE is added after the high power amplifier, additional improvement to the total transmit SNR may be achieved, but the loss of the SNE (typically 2-4 dB) may be a significant detriment to system performance as the prime power efficiency may be significantly degraded. By using the SNEs prior to the high power amplifier, the decrease in efficiency is minor as the power levels present at each SNE are relatively low compared to the transmit power at each element.

In array antenna architectures in which a DAC 400 is present at every element, an SNE 410 may be inserted following each DAC 400, amplifier 405, or other noise generating device in the transmit chain, if the signal power level at the insertion point is within the design input power range of the SNE 410. SNEs 410 may be used before and/or after frequency conversion, depending on the RF frequency used and the ability of the SNE to operate in the desired band.

Embodiments of the present invention provide a significant improvement in the transmit noise of phased array and element-level digitally-beamformed systems. Further, they provide these improvements by automatically adapting to the instantaneous operating environment, requiring no input or control from the user, and with no need for calibration.

The reduction in transmit noise enabled by embodiments of the present invention improves co-site interoperability of multiple systems, applicable to both military and commercial systems.

In embodiments of the present invention, the SNE 410 is naturally tunable over wide bandwidths, forming a filtering response within a few hundred nanoseconds (ns) automatically. Significant attenuation, exceeding 60 dB, of in-band noise is possible prior to the high power amplifier. Improvements in signal to noise ratio may be provided for all frequencies in close proximity to (e.g., within 30 MHz of) the transmitted waveform, enabling improved electromagnetic interference performance, and interoperability in co-site environments. Embodiments of the present invention have flexibility to adapt to new band plans without hardware changes, provide the ability to tune to a new frequency an order of magnitude faster than micro-electromechanical systems (MEMS), and require no control or power dissipation to achieve tunability. Embodiments of the present have a wide range of potential applications, including commercial applications such as cellular communications transmitters.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the term "substantially", "about," and similar terms are used as terms of approximation and not as terms of degree, and are intended to account for the inherent deviations in measured or calculated values that would be recognized by those of ordinary skill in the art. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of", when preceding a list of elements, modify the entire list of elements and do not modify the individual elements of the list. Further, the use of "may" when describing embodiments of the inventive concept refers to "one or more embodiments of present invention". Also, the term "exemplary" is intended to refer to an example or illustration.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Although limited embodiments of a transmit noise have been specifically described and illustrated herein, many modifications and variations will be apparent to those skilled in the art. Accordingly, it is to be understood that a transmit noise reducer employed according to principles of this invention may be embodied other than as specifically described herein. The invention is also defined in the following claims, and equivalents thereof.

What is claimed is:

1. A transmit system, comprising:
a digital-to-analog converter (DAC) having a digital input and an analog output;
a first amplifier, having an input and an output, the input of the first amplifier being connected to the analog output of the DAC;
a first signal-to-noise enhancer (SNE) having an input and an output, the input of the first SNE being connected to the output of the first amplifier, a second amplifier, having an input and an output, the input of the second amplifier being connected to the first SNE; and a second SNE having an input and an output, the input of the second SNE being connected to the output of the second amplifier, wherein each of the first SNE and second SNE comprising:
a microwave transmission line connected between the input and the output of the first SNE;
a magnetic component capable of supporting magneto static waves, the magnetic component secured in proximity to the microwave transmission line;
one or more magnets secured in proximity to the magnetic component;
the first SNE having the characteristic of allowing a signal to propagate from the input of the first SNE to the output of the first SNE:
with a first attenuation when the power of the signal at the input of the SNE is less than a first threshold, and
with a second attenuation when the power of the signal at the input of the SNE is greater than a second threshold,
the first attenuation exceeding the second attenuation by at least 5 decibels (dB).

2. The transmit system of claim 1, wherein the output of the second SNE is connected to a transmitting antenna.

3. The transmit system of claim 1, wherein the magnetic component comprises a thin film of yttrium iron garnet (YIG) on a gadolinium gallium garnet (GGG) substrate.

4. The transmit system of claim 3, wherein the thin film of YIG is a single crystal of YIG, the GGG substrate is a single crystal of GGG, and the thin film of YIG is lattice-matched to the GGG substrate.

5. The transmit system of claim 1, wherein a portion of the transmission line in proximity with the magnetic component follows a substantially straight path.

6. The transmit system of claim 5, wherein the one or more magnets comprise two magnets, positioned and oriented with respect to the portion of the microwave transmission line so as to produce, in the magnetic component, a biasing magnetic field substantially parallel to the portion of the microwave transmission line.

7. The transmit system of claim 1, further comprising a plurality of additional components connected in cascade to form a chain having an input and an output, the output of the second SNE connected to the input of the chain,
the plurality of additional components comprising one or more additional SNEs and one or more additional amplifiers, the additional SNEs and the additional amplifiers alternating in the chain,
each additional SNE of the one or more additional SNEs having an input and an output,
each additional SNE of the one or more additional SNEs comprising:
a microwave transmission line connected between the input and the output of the additional SNE;
a magnetic component capable of supporting magnetostatic waves; the magnetic component secured in proximity to the microwave transmission line;
one or more magnets secured in proximity to the magnetic component;
each additional SNE of the one or more additional SNEs having the characteristic of allowing a signal to propagate from the input of the additional SNE to the output of the additional SNE:
with a first attenuation when the power of the signal at the input of the SNE is less than a first threshold, and
with a second attenuation when the power of the signal at the input of the SNE is greater than a second threshold,
the first attenuation exceeding the second attenuation by at least 5 decibels (dB).

8. The transmit system of claim 7, wherein the chain comprises, as a final element, an amplifier of the one or more additional amplifiers.

9. The transmit system of claim 7, wherein the chain comprises, as a final element, an SNE of the one or more additional SNEs.

10. The transmit system of claim 9, wherein the output of the chain is connected to a transmitting antenna.

11. A transmit system, comprising:
a first amplifier, having an input and an output;
a plurality of signal-to-noise enhancers (SNEs) having an input and an output, each signal-to-noise enhancer (SNE) of the plurality of SNEs comprising:
a microwave transmission line connected between the input and the output of the first SNE;
a magnetic component capable of supporting magnetostatic waves, the magnetic component secured in proximity to the microwave transmission line;
one or more magnets secured in proximity to the magnetic component;
the first SNE having the characteristic of allowing a signal to propagate from the input of the first SNE to the output of the first SNE:
with a first attenuation when the power of the signal at the input of the SNE is less than a first threshold, and
with a second attenuation when the power of the signal at the input of the SNE is greater than a second threshold,
the first attenuation exceeding the second attenuation by at least 5 decibels (dB); and
the plurality of SNEs comprising a first SNE and a plurality of additional SNEs, the input of the first SNE being connected to the output of the first amplifier;
a plurality of additional components comprising:
one or more splitters; and
a plurality of additional amplifiers,
the plurality of additional components and the plurality of additional SNEs being connected in a tree structure having an input and a plurality of outputs, the output of the first SNE connected to the input of the tree structure.

12. The transmit system of claim 11, wherein each output of the plurality of outputs of the tree structure is connected to a transmitting antenna.

13. The transmit system of claim 11, wherein:
the one or more splitters comprise a first splitter comprising an input and a plurality of outputs;
the output of the first SNE is connected to the input of the first splitter;
each of the outputs of the first splitter is connected to one of a plurality of first cascades,
each of the first cascades being a cascade of an amplifier of the additional amplifiers and an SNE of the additional SNEs,
each of the first cascades comprising an input and an output,
the input of each first cascade being connected to the input of the amplifier of the first cascade,
the output of the amplifier of each first cascade being connected to the input of the SNE of the first cascade, and
the output of the SNE of each first cascade being connected to the output of the first cascade.

14. The transmit system of claim 13, wherein the output of each cascade of the plurality of first cascades is connected to a transmitting antenna.

15. The transmit system of claim 13, wherein:
the one or more splitters further comprise a plurality of second splitters, each comprising an input and a plurality of outputs;
the input of each of the plurality of second splitters being connected to the output of a respective first cascade,
each output of each of the plurality of second splitters being connected to one of a plurality of second cascades,
each of the second cascades being a cascade of an amplifier of the additional amplifiers and an SNE of the additional SNEs,
each of the second cascades comprising an input and an output,
the input of each second cascade being connected to the input of the amplifier of the second cascade,
the output of the amplifier of each second cascade being connected to the input of the SNE of the second cascade, and
the output of the SNE of each second cascade being connected to the output of the second cascade.

16. The transmit system of claim 15, wherein the output of each cascade of the plurality of second cascades is connected to a transmitting antenna.

17. The transmit system of claim 11, further comprising a digital-to-analog converter (DAC) having a digital input and an analog output, the output of the DAC being connected to the input of the first amplifier.

\* \* \* \* \*